United States Patent [19]

Akagawa et al.

[11] Patent Number: 5,888,327
[45] Date of Patent: Mar. 30, 1999

[54] PELLICLE PASTING SYSTEM AND METHOD

[75] Inventors: Masayuki Akagawa, Saitama; Yoshihiro Kimura, Yokohama, both of Japan

[73] Assignee: Nikon Corporation, Tokyo, Japan

[21] Appl. No.: 857,560

[22] Filed: May 16, 1997

[30] Foreign Application Priority Data

May 17, 1996 [JP] Japan ..................................... 8-148439

[51] Int. Cl.⁶ ..................................................... B32B 31/00
[52] U.S. Cl. .......................... 156/64; 156/281; 156/379; 156/556; 356/237.2; 356/237.4; 250/559.41
[58] Field of Search ............................. 156/64, 281, 379, 156/556; 356/237.2, 445, 237.4; 250/559.01, 559.11, 559.41, 559.45

[56] References Cited

U.S. PATENT DOCUMENTS

| | | | |
|---|---|---|---|
| 4,422,547 | 12/1983 | Abe et al. ................................ | 206/454 |
| 4,468,120 | 8/1984 | Tanimoto et al. ...................... | 356/237 |
| 4,716,299 | 12/1987 | Tanaka et al. ...................... | 250/559.01 |
| 4,999,511 | 3/1991 | Kohno ................................. | 250/559.11 |
| 4,999,671 | 3/1991 | Iizuka .......................................... | 355/97 |
| 5,314,564 | 5/1994 | Kobayashi .......................... | 156/379 X |
| 5,591,985 | 1/1997 | Tsuji et al. .......................... | 250/559.45 |

*Primary Examiner*—Mark A. Osele
*Attorney, Agent, or Firm*—Morgan, Lewis & Bockius LLP

[57] ABSTRACT

A pellicle pasting system and method pastes a pellicle on a mask. The system includes a washing apparatus to wash the mask; a first mask transport apparatus to transport the mask washed by the washing apparatus; a first inspection apparatus to inspect whether foreign objects are attached to the mask received from the first mask transport apparatus; a second mask transport apparatus to transport the mask when the first inspection apparatus determines that the foreign objects are substantially absent from the mask; and a pellicle pasting apparatus to paste the pellicle on the mask received from the second mask transport apparatus.

30 Claims, 7 Drawing Sheets

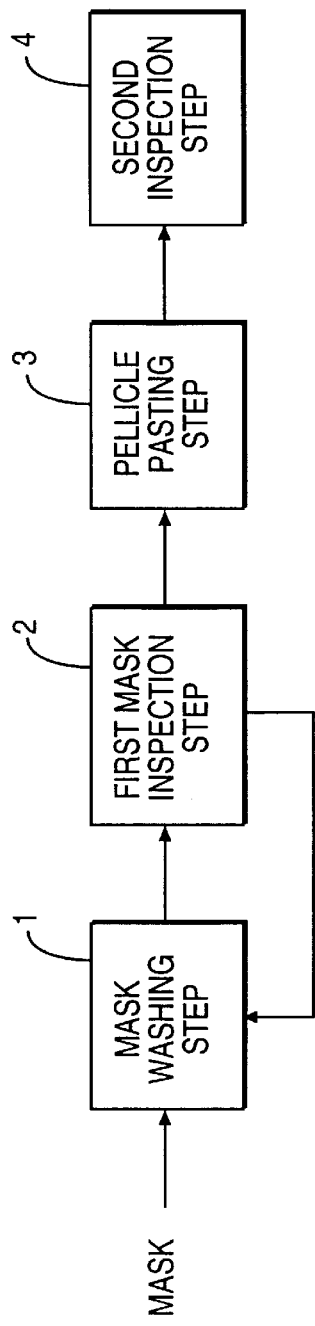
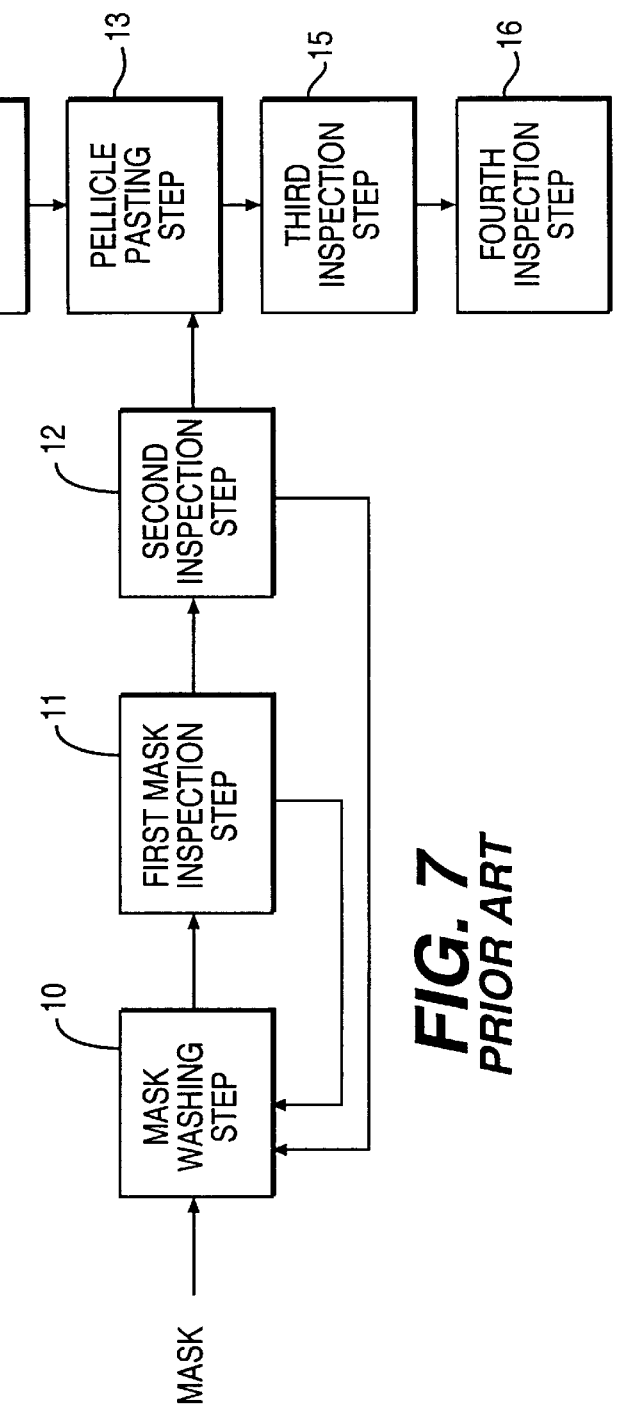
FIG. 6 *PRIOR ART*
FIG. 7 *PRIOR ART*

PELLICLE PASTING SYSTEM AND METHOD

This application claims the benefit of Application No. 8-148439, filed in Japan on May 17, 1996, which is hereby incorporated by reference.

BACKGROUND OF THE INVENTION

1. Field of the Invention

The present invention relates to a pellicle pasting system and a pellicle pasting method, and more particularly to a pellicle pasting system and method to paste pellicle on a mask (reticle).

2. Discussion of the Related Art

In recent years, integrated circuit (IC) manufacturing has become finer and more advanced. Accordingly, the prevention of foreign objects, such as minute dust and dirt, from attaching to surfaces during manufacturing has become extremely important.

As a result, a pellicle pasted mask having a light transmitting thin film called pellicle (foreign object prevention film) is used widely today to prevent attachment of foreign objects on the mask before a circuit pattern is formed on the mask. The pellicle is then transferred onto an exposed substrate using an exposure apparatus during a photolithography step in the IC manufacturing process.

In this way, attachment of foreign objects on the mask is prevented beforehand by spreading the pellicle on a pellicle frame, fixing the pellicle frame and the mask by bonding, and mounting the pellicle frame to cover the mask surface. In this case, if foreign objects are attached to the pellicle, even if the mask is free of foreign objects, the foreign objects will fall on the mask and attach on the circuit pattern surface of the mask, thereby causing an image of the foreign objects to be transferred to the exposed substrate. Thus, defective products and decreased yields result. Hence, it is vital that the mask and the pellicle are free from the foreign objects.

A conventional pellicle pasting method for a conventional pellicle pasting apparatus will now be described with reference to FIG. 6.

To begin with, the pellicle pasting apparatus, after washing the mask during a mask washing step 1 of a mask washing unit, determines whether foreign objects larger than 0.5 $\mu$m, such as dust and dirt (hereafter, the first foreign objects), which do not transmit light are attached on the mask during the first mask inspection step 2 of the first mask inspection unit, and if the first foreign objects are attached on the mask, the mask is washed again in the mask washing step 1 in the mask washing unit.

If the first foreign objects are not attached on the mask during the first inspection step 2 of the first inspection unit, the pellicle pasting apparatus pastes the pellicle on the mask during the pellicle pasting step 3 using the pellicle pasting unit. Here, the pellicle is inspected beforehand by the worker's eye to determine whether foreign objects are attached on the pellicle. Next, the pellicle pasting apparatus inspects whether the first foreign objects are attached on the pellicle pasted mask during the second inspection step 4 using the first inspection unit. If the first foreign objects are not attached on the pellicle pasted mask, the pellicle pasted mask is stored in a special mask case.

However, if the first foreign objects are attached on the pellicle pasted mask, the process steps from the mask washing step to the second mask inspection step 4 are repeated. Moreover, because the first inspection step of the first inspection unit and the second inspection step of the first inspection unit are actually the same inspection, the second inspection step is executed in the first inspection unit.

The pellicle pasting system comprises a mask washing unit, a first inspection unit and a pellicle pasting unit, wherein each processing unit is independent from the other. Hence, in the pellicle pasting system, the mask moves sequentially from the mask washing unit (mask washing step) to the first inspection unit (the first inspection step), to the pellicle pasting unit, to the first inspection unit (the second inspection step), and to the mask washing unit. After each step, a worker must store the mask or the pellicle pasted mask in the special mask case and carry the case to the subsequent process unit or to the previous process unit.

However, because the worker moves the mask or the pellicle pasted mask to the subsequent process step and to the previous process step, the probability of foreign objects attaching to the mask or the pellicle pasted mask increases even though the mask or the pellicle pasted mask is carried in the special mask case. Hence, it is difficult to maintain low contamination levels in the pellicle pasting system.

A proposed pellicle pasting system to resolve such problems moves the mask and the pellicle pasted mask from the first inspection unit to the pellicle pasting unit, and moves the mask and the pellicle pasted mask from the pellicle pasting unit to the first inspection unit automatically using a mask transport apparatus. In such pellicle pasting apparatus, all the mask movements except for movement between the mask washing unit and the first inspection unit are executed by the mask transport apparatus, thereby substantially reducing the possibility of foreign objects attaching to the mask and the pellicle pasted mask.

Also, the foreign objects which attach to the mask and the pellicle pasted mask and which are targeted as ones preventing improved yields are larger than 0.5 $\mu$m which do not transmit light as described above. Hence, the first and the second inspection steps of the first inspection unit concerns with the attachment of such first foreign objects on the mask and the pellicle pasted mask. However, as mentioned above, integrated circuits are becoming increasingly finer in recent years. Thus, foreign objects, such as oil and the like which are semi-transparent, flat, partially light-transmitting foreign objects (hereafter, referred to as the second foreign objects), which previously were not the primary source problems when attached to the mask and the pellicle pasted mask, are beginning to be a large source of problems. Moreover, the traditional inspection by eye cannot detect the second foreign objects described above. Accordingly, a need has become apparent for automatic inspection using a specific inspection apparatus to determine whether foreign objects are attached to the pellicle.

Hence, a pellicle pasting apparatus has been proposed wherein a specific inspection apparatus is used to inspect foreign objects on the pellicle in addition to execution of the first inspection step to inspect to determine whether the first foreign objects are attached to the mask and the second inspection step to determine whether any second foreign objects are attached to the mask before and after the pasting of the pellicle on the mask. The process of this pellicle pasting method using a conventional pellicle pasting system will now be described with reference to FIG. 7.

To begin, the pellicle pasting system, after washing the mask during a mask washing step 10 of a mask washing unit, inspects whether any first foreign objects are attached to the mask in the first mask inspection step 11 using the first mask inspection unit. If first foreign objects are attached to the mask, the mask is washed again in the mask washing step 10. If first foreign objects are not attached to the mask, the apparatus moves to the second inspection step 12 using the second inspection unit.

During the second inspection step 12 inspection unit, the pellicle pasting system determines whether any second foreign objects are attached to the mask. If the second foreign objects are attached to the mask, the mask washing step 10 of the mask washing unit and the first inspection step 11 are repeated. The pellicle pasting system then pastes the pellicle on the mask during the pellicle pasting step 13 using a pellicle pasting unit if the second foreign objects are not attached to the mask.

As far as the foreign object inspection of the pellicle is concerned, the inspection is executed using a specific inspection apparatus during the pellicle inspection step 14 of the pellicle inspection unit. Then, the pellicle, which is determined not to have foreign objects, is moved to the pellicle pasting unit. Next, the pellicle pasting system determines whether any first foreign objects are attached to the pellicle pasted mask during the third inspection step 15 of the first inspection unit. Then, the pellicle pasting system determines whether any second foreign objects are attached to the pellicle pasted mask during the fourth inspection step 16 of the second inspection unit.

Here, the first inspection step 11 of the first inspection unit and the third inspection step 15 of the first inspection unit are the same type of inspections, and the second inspection step 12 of the second inspection unit and the fourth inspection step 16 of the second inspection unit are the same type of inspections. Hence, the third inspection step and the fourth inspection step are actually executed in the first inspection unit and the second inspection unit, respectively.

Moreover, each processing unit of the pellicle pasting system described above operates so that the mask stored in the original position of a mask storage case 17, such as the one shown in FIG. 8. For example in practice, a worker hand carries the case 17 after washing is completed by the mask washing unit to the first inspection unit, where the next process step takes place. In this case, two mask storage cases 17, one to supply the mask at each processing unit and the other to store processed mask are provided.

Moreover, during the first inspection step 11 of the first inspection unit, the mask for which the first foreign objects are determined to be attached is stored with the mask for which the first foreign objects are determined not to be attached in the original position of the mask storage case 17 and the worker is to separate the mask with foreign objects and carries them in separate storage case to the mask washing unit.

In the pellicle pasting system described above, mask movement from the first inspection unit to the second inspection unit and from the second inspection unit to the pellicle pasting unit is automatically done using a specific transport apparatus and not manually. The movement of the mask and the pellicle pasted mask other than between these processing units and from pellicle inspection unit to pellicle pasting unit is performed manually.

However, in the pellicle pasting system, the number of processing steps has increased compared to the pellicle pasting apparatus described earlier by the second inspection step and the fourth inspection step. Thus, the number of movements of the mask and the pellicle pasted mask increases by the same amount. Hence, the possibility that the foreign objects attach to the mask and the pellicle pasted mask increases with the increased the number of mask transfers and the pellicle pasted mask, thereby resulting in further difficulties in managing the degree of cleanliness for the pellicle pasting system. Accordingly, a which, in turn, causes substantial decline in yield of the pellicle pasted mask results.

SUMMARY OF THE INVENTION

Accordingly, the present invention is directed to a pellicle pasting system and method that substantially obviates one or more of the problems due to limitations and disadvantages of the related art.

Considering the problems described above, the present invention aims to provide a pellicle pasting system and a pellicle pasting method with increased yield.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the pellicle pasting system, for pasting a pellicle on a mask, includes a washing apparatus to wash the mask; a first mask transport apparatus to transport the mask washed by the washing apparatus; a first inspection apparatus to inspect whether foreign objects are attached to the mask received from the first mask transport apparatus; a second mask transport apparatus to transport the mask when the first inspection apparatus determines that the foreign objects are substantially absent from the mask; and a pellicle pasting apparatus to paste the pellicle on the mask received from the second mask transport apparatus.

In another aspect, the pellicle pasting method, for pasting a pellicle on a mask, includes a washing step to wash the mask using a washing apparatus; a first mask transport step using a first transport apparatus to transport the washed mask from the washing apparatus to a first inspection apparatus; a first inspection step using a first inspection apparatus to inspect whether foreign objects are attached to the mask transported by the first mask transport apparatus; a second mask transport step to transport the mask from the first inspection apparatus to the pellicle pasting apparatus using the second mask transport means; and a pellicle pasting step to paste the pellicle on the mask using a pellicle pasting apparatus.

To further achieve these and other advantages and in accordance with the purpose of the present invention, as embodied and broadly described, the pellicle pasting system for pasting a pellicle on a mask for which a predetermined circuit pattern is formed includes a washing means to wash the mask, a first mask transport means to transport the mask washed by the washing means, a first inspection means to determine whether or not foreign objects are attached on the mask which is transported by the first transport means, a second mask transport means which transports the mask that is determined not to have foreign objects attached at the first inspection means, and a pellicle pasting means to paste the pellicle on the mask that is transported by the second mask transport means.

In another aspect, the pellicle pasting method for pasting a pellicle on a mask for which predetermined circuit pattern is formed includes the steps of a washing step to wash the mask by a washing means, a first mask transport step to transport the mask washed by the washing means to a first inspection means, a first inspection step to determine whether or not foreign objects are attached on the mask which is transported by the first transport means, a second mask transport step to transport the mask that is inspected by the first inspection means to the pellicle pasting means by the second mask transport means, and a pellicle pasting step to paste the pellicle on the mask that is transported by the second mask transport means.

The movement of the mask from the washing means to the first inspection means and the movement of the mask from the first inspection means to the pellicle pasting means are executed without using human hands. Hence, attachment of foreign objects on the mask is surely prevented during movement of the mask from the washing means to the first inspection means. Moreover, attachment of foreign objects on the mask is surely prevented during movement of the mask from the first inspection means to the pellicle pasting means.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 6 is a flow chart of the process flow of a conventional pellicle pasting method;

FIG. 7 is a flow chart of the process flow of a conventional pellicle pasting method.

DETAILED DESCRIPTION OF THE PREFERRED EMBODIMENTS

Reference will now be made in detail to the preferred embodiments of the present invention, examples of which are illustrated in the accompanying drawings.

Figure 1:
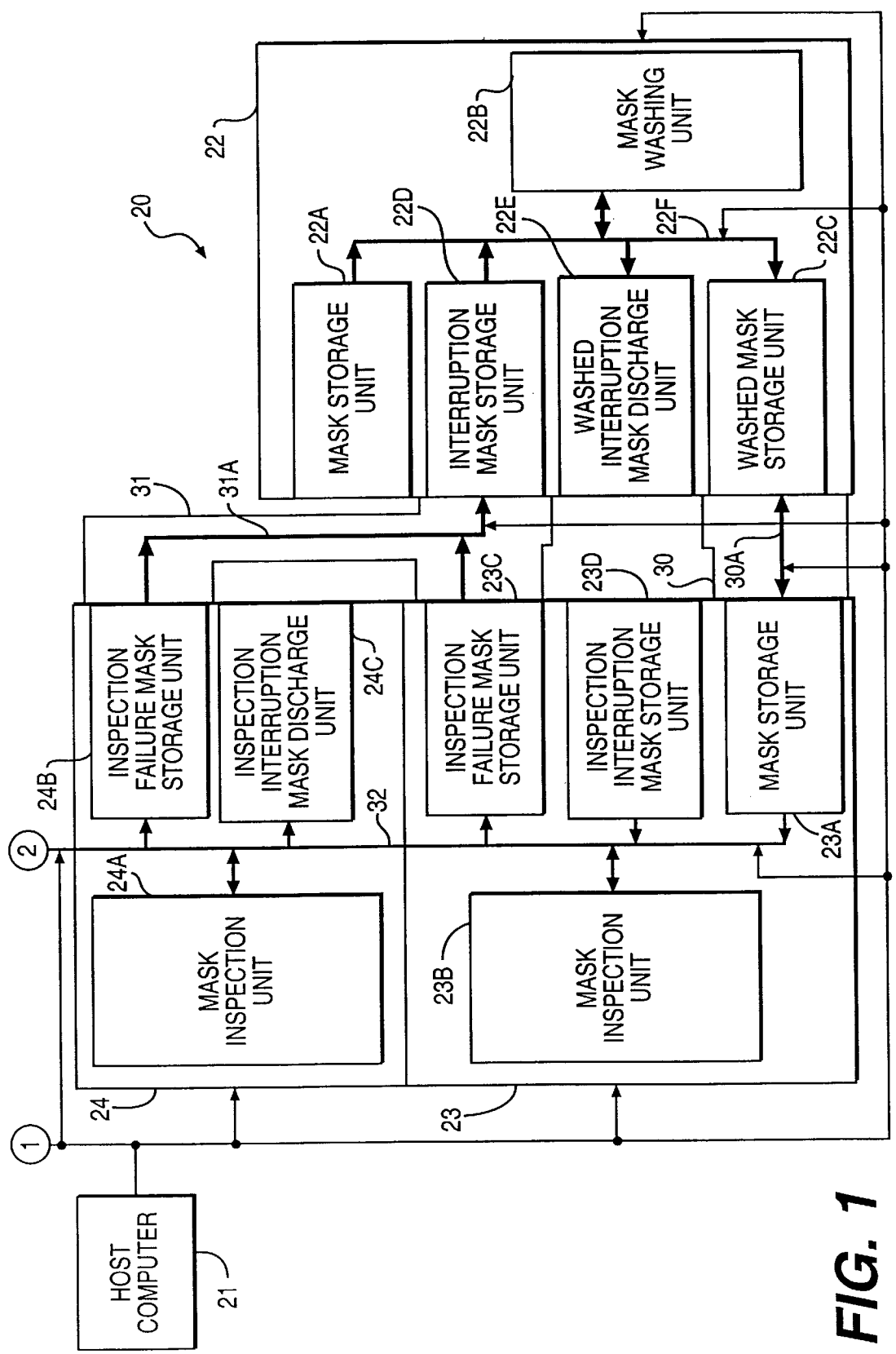
FIGS. 1 and 2 are block diagrams of the structure of the pellicle pasting system according to a first embodiment of the present invention.
Figure 2:
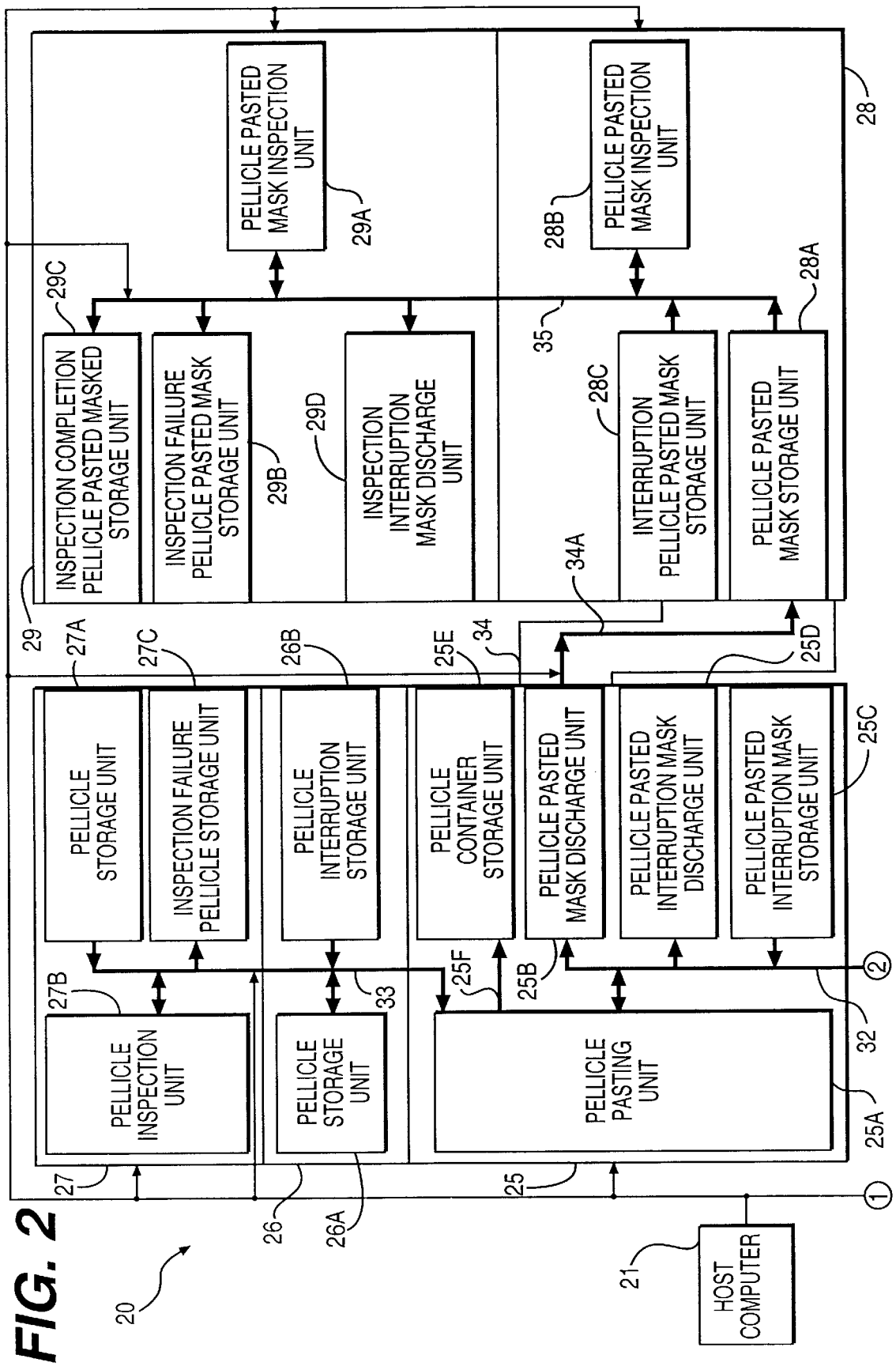

FIGS. 1 and 2 show a pellicle pasting system 20 according to a first embodiment of the present invention. Here, the pellicle pasting system 20 comprises a host computer 21, a mask washing apparatus 22, a first mask inspection apparatus 23, a second inspection apparatus 24, a pasting apparatus 25, a pellicle storage apparatus 26, a pellicle inspection apparatus 27, a first pellicle pasted mask inspection apparatus 28, and a second pellicle pasted mask inspection apparatus 29, wherein the movement of the mask, the pellicle, and the movements are automatic. Further, the movement of the mask between apparatus is automatic.

The host computer 21 controls the entire pellicle pasting apparatus 20 by sending control signals corresponding to input modes of the operator to the mask washing apparatus 22, the first mask inspection apparatus 23, the second mask inspection apparatus 24, the pellicle pasting apparatus 25, the pellicle storage apparatus 26, the pellicle inspection apparatus 27, the first pellicle pasted mask inspection apparatus 28, and the second pellicle pasted mask inspection apparatus 29. Moreover, the host computer 21 recognizes which mask is being processed at the mask washing means 22, the first mask inspection apparatus 23, the second inspection apparatus 24, the pellicle pasting apparatus 25, the pellicle storage apparatus 26, the pellicle inspection apparatus 27, the first pellicle pasted mask inspection apparatus 28, and the second pellicle pasted mask inspection apparatus 29.

In other words, each mask is assigned an identification number, and the host computer 21 recognizes which mask is being processed at each apparatus by the signals sent by each apparatus corresponding to the identification number. Moreover, the host computer 21 receives signals from the first mask inspection apparatus 23 and the second inspection apparatus 24 corresponding to information on the mask having failed inspection (hereafter, an inspection failure mask) at the first mask inspection apparatus 23 or the second inspection apparatus 24, and recognizes the inspection failure mask based on the signals.

The mask washing apparatus 22 comprises the mask storage unit 22A, the mask washing unit 22B, the washed mask discharge unit 22C, the interruption mask storage unit 22D, the washed interruption mask discharge unit 22E, and the mask transport unit 22F. Each unit of the mask washing apparatus 22 is disposed in a clean room that is maintained at a predetermined level of cleanliness. The mask washing apparatus 22 transports the mask stored in the mask storage unit 22A to the mask washing unit 22B using the mask transport unit 22F where the mask is washed by the mask washing unit 22B. Washing conditions at the mask washing unit 22B may be selected as desired by the operator using the host computer 21. Further, the mask washing unit 22B comprises a plurality of washing units corresponding to the washing conditions.

The mask washing apparatus 22 stores the washed mask from the mask washing unit 22B to the washed mask discharge unit 22C using the mask transport apparatus 22F. The washed mask discharge unit 22C is connected to the mask storage unit 23A of the first mask inspection apparatus 23 through the transport path 30 which is sealed to maintain purity at a predetermined level. The mask transport apparatus 30A is provided in the transport path 30 to transport the washed mask from the washed mask discharge unit 22C to the mask storage unit 23A through the transport path 30.

The interruption storage unit 22D is connected to the first mask inspection apparatus 23 and to the mask inspection apparatus 24 through the transport path 31 which is sealed to maintain purity at a predetermined level. If a mask is determined by the first mask inspection apparatus 23 and the second inspection apparatus 24 to have the first foreign object and the second foreign object attached, the mask is declared an inspection failure (hereafter, the inspection failure mask). The inspection failure mask is transported by the mask transport apparatus 31A to be stored in the interruption mask storage unit 22D.

Moreover, the mask for which only washing process is executed at the mask washing apparatus 22 (hereafter, the wash interruption mask) is stored in the interruption mask storage unit 22D. The wash interruption which is washed at the mask washing unit 22B (hereafter, the washed interruption mask) is stored in the washed interruption mask discharge unit 22E.

The first mask inspection apparatus 23 comprises a mask storage unit 23A, a mask inspection unit 23B, an inspection failure mask discharge unit 23C, and an interruption mask storage unit 23D. Each unit of the first mask inspection unit is disposed in a clean room that is maintained at a predetermined purity level. Moreover, the mask transport apparatus 32 is provided in the first mask inspection apparatus 23 to move the mask from the first mask inspection apparatus 23 to the pasting apparatus 25 through the second mask inspection apparatus 24.

The first mask inspection apparatus 23 transports the washed mask stored in the mask storage unit 23 to the mask inspection unit 23B using the mask transport apparatus 32 and determines whether any first foreign objects are attached to the mask at the mask inspection unit 23B. If the first mask inspection apparatus 23 determines, at the mask inspection unit 23B, that a first foreign object is attached to the inspected mask, the mask is declared an inspection failure mask. Thus, the inspection failure mask is transported and stored, as to the inspection failure mask discharge unit 23C by the mask transport apparatus 32. Moreover, if the first mask inspection apparatus 23 determines, at the mask inspection unit 23B, that a first foreign object is not attached to the mask being inspected, the mask is declared an inspection passing mask, and is transported to the second mask inspection apparatus 24 by the mask transport apparatus 32. A mask which is only inspected at the first inspection apparatus 23 and the second inspection apparatus (hereafter, the inspection interruption mask) is stored in the interruption storage unit 23D.

The second mask inspection apparatus 24 comprises the mask inspection unit 24A, the inspection failure mask discharge unit 24B, and the inspection interruption mask discharge unit 24C. Each unit of the second mask inspection apparatus 24 is disposed in a clean room maintained at a predetermined purity level. The second inspection apparatus 24 transports the inspection passing mask using the mask transport apparatus 32 from the first mask inspection apparatus 23 to the mask inspection unit 24A, which determines whether a second foreign object is attached to the mask. If a second foreign object is not attached to the mask being inspected, the mask is transported as a inspection passing mask to the pellicle pasting unit 25A of the pellicle pasting apparatus 25 using the mask transport apparatus 32.

If the second mask inspection apparatus 24 determines that the second foreign object is attached to the mask being inspected, the mask is stored as an inspection failure mask in the inspection failure mask discharge unit 24B. Hence, a mask that passes the inspection at the first mask inspection apparatus 24 but fails the inspection at the second mask inspection apparatus 24 is stored in the inspection failure mask discharge unit 24B of the second mask inspection apparatus 24. An inspection interruption mask which is inspected at the first mask inspection apparatus 23 and the second inspection apparatus 24 is stored as the inspected interruption mask in the inspected interruption mask discharge unit 24C.

The pasting apparatus 25 comprises a pellicle pasting unit 25A, a pellicle pasted mask discharge unit 25B, a pellicle pasting interruption storage unit 25C, a pellicle pasted interruption mask discharge unit 25D, and a pellicle container storage unit 25E. Each unit is disposed in a clean room maintained at a predetermined purity level. The pellicle pasting apparatus 25 pastes the pellicle, which is transported on the inspection passing mask from the pellicle storage apparatus 26 by the pellicle transport apparatus 33 at the pellicle pasting unit 25A. The pellicle pasted mask is transported using the mask transport apparatus 32 and is stored in the pellicle pasted mask discharge unit 25B. Here, the pellicle is transported from the pellicle storage apparatus 26 in a container. The pellicle pasting unit 25A removes the pellicle from the container and pastes the pellicle on the inspection passing mask. Moreover, the container from which the pellicle is removed is transported using the container transport apparatus 25F to be stored in the pellicle container storage unit 25E.

The pellicle pasted mask discharge unit 25B is connected to the pellicle pasted mask storage unit 28A of the first pellicle pasted mask inspection apparatus 28 through the sealed transport path 34 maintained at predetermined purity level. The pellicle pasted mask which is stored in the pellicle pasted mask discharge unit 25B is transported to the pellicle pasted mask storage unit 28A of the first pellicle pasted mask inspection apparatus 28 using the pellicle pasted mask transport apparatus 34 through the transport path 34A.

The mask for which only pellicle pasting process is executed at the pellicle pasting unit 25A (hereafter, the pellicle pasted interruption mask) is stored in the pellicle pasted interruption mask storage unit 25C. The pellicle pasting interruption mask on which pellicle is pasted at the pellicle pasting unit 25A (hereafter, the pellicle pasted interruption mask) is stored in the pellicle pasted interruption mask discharge unit 25D.

The pellicle inspection apparatus 27 comprises a pellicle storage unit 27A, a pellicle inspection unit 27B, and an inspection failure pellicle discharge unit 27C. Each unit is disposed in a clean room maintained at a predetermined purity level. The pellicle transport apparatus 33, which is made to move from the pellicle inspection apparatus 27 to the pellicle pasting apparatus 25 through the pellicle storage apparatus 26, is provided in the pellicle inspection apparatus 27.

The pellicle inspection apparatus 27 transports the pellicle stored in the pellicle storage unit 27A to the pellicle inspection unit 27B using the pellicle transport apparatus 33 and inspects whether foreign objects are attached to the pellicle to be inspected by the pellicle inspection unit 27B. Here, a plurality of types of pellicle are stored in the pellicle storage unit 27A, for example, corresponding to masks equivalent of a particular lot.

If the first foreign object and/or the second foreign object are determined not to be attached to the pellicle at the pellicle inspection unit 27B, the pellicle inspection apparatus 27 transports the pellicle to and stores in the pellicle storage unit 26A of the pellicle storage apparatus 26 using the pellicle transport apparatus 33. Moreover, if any first foreign objects and/or any second foreign objects are determined to be attached to the pellicle at the pellicle inspection unit 27A, the pellicle inspection apparatus 27, transports the pellicle to and stores in the inspection failure pellicle discharge unit 27C using the pellicle transport apparatus 33.

In this case, when the failure passing mask is transported to the pasting apparatus 25, the pellicle inspection apparatus 27 transports and stores the inspection passing pellicle beforehand to the pellicle storage apparatus 26 so that the pellicle storage apparatus 26 may transport the pellicle corresponding to the mask to the pasting apparatus 25. Here, each pellicle is stored in the pellicle storage unit 27A in a container. Hence, the pellicle inspection unit 27A removes the pellicle from the container to inspect the pellicle and stores the pellicle back in the container after the inspection.

The pellicle storage apparatus 26 comprises a pellicle storage unit 26A and an interruption pellicle storage unit 26B. Each unit is disposed in a clean room maintained at a predetermined purity level. Based on the control signals from the host computer 21, the pellicle storage apparatus 26 transports the pellicle corresponding to the mask transported to the pellicle pasting unit 25A of the pellicle pasting apparatus 25 from the pellicle storage unit 26A to the pellicle pasting unit 25 with a timing of the mask being transported to the pellicle pasting unit 25A. In other words, in the pellicle pasting system 20, when the mask to be targeted for pellicle pasting is transported to the pellicle pasting unit 25A, the pellicle to be pasted on the mask is made to be transported from the pellicle storage unit 26A. The type of pellicle corresponding to the pellicle pasting interruption mask in the pellicle pasting interruption mask storage unit 25C of the pasting apparatus 25 is stored in the interruption pellicle storage unit 26B.

The first pellicle pasted mask inspection apparatus 28 comprises a pellicle pasted mask storage unit 28A, a pellicle pasted mask inspection unit 28B, and an inspection interruption pellicle pasted mask storage unit 28C. Each unit is disposed in a clean room maintained at a predetermined purity level. The pellicle pasted mask transport apparatus 35, for moving between the first pellicle pasted mask inspection apparatus 28 and the second pellicle pasted mask inspection apparatus 29, is provided in the first pellicle pasted mask inspection apparatus 28. The first pellicle pasted mask inspection apparatus 28 transports the pellicle pasted mask stored in the pellicle pasted mask storage unit 28A to the pellicle pasted mask inspection unit 28B using the pellicle pasted mask transport apparatus 35 to determine whether any first foreign objects are attached to the pellicle pasted mask at the pellicle pasted mask inspection unit 28B.

When the first pellicle pasted mask inspection apparatus 28 determines that the first foreign object is not attached to the pellicle pasted mask at the pellicle pasted mask inspection unit 28B, the pellicle pasted mask is transported as an inspection passing pellicle pasted mask to the pellicle pasted mask inspection unit 29A of the second pellicle pasted mask inspection apparatus 29 using the pellicle pasted mask transport apparatus 35. Moreover, when the first pellicle pasted mask inspection apparatus 28 determines that a first foreign object is attached to the pellicle pasted mask at the pellicle pasted inspection unit 28B, the pellicle pasted mask is transported and stored as the inspection failure pellicle pasted mask to the pellicle pasted mask discharge unit 29B of the second pellicle pasted mask inspection apparatus 29 using the pellicle pasted mask transport apparatus 35.

The pellicle pasted mask for which only inspection at the first pellicle pasted mask inspection apparatus 28 and the second pellicle pasted mask inspection apparatus 29 is executed, for example, the pellicle pasted mask that is already used for exposure, is stored in the inspection interruption pellicle pasted mask storage unit 28C.

The second pellicle pasted mask inspection apparatus 29 comprises a pellicle pasted mask inspection unit 29A, an inspection failure pellicle pasted mask discharge unit 29B, an inspected pellicle pasted mask discharge unit 29C, and an inspection interruption pasted mask discharge unit 29D. Each unit is disposed in a clean room maintained at a predetermined purity level. The pellicle pasted mask inspection unit 29A of the second pellicle pasted mask inspection apparatus 29 determines whether a second foreign object is attached to the pellicle pasted mask received from the first pellicle pasted mask inspection apparatus 28 using the pellicle pasted mask transport apparatus 35. When second pellicle pasted mask inspection apparatus 29 determines that a second foreign object is not attached on the pellicle pasted mask at the pellicle pasted mask inspection unit 29A, the pellicle pasted mask is stored in the inspected pellicle pasted mask discharge unit 29C using the pellicle pasted mask transport apparatus 35. Moreover, when the second pellicle pasted mask inspection apparatus 29 determines that a first foreign object is attached on the pellicle pasted mask at the pellicle pasted inspection unit 29A, the pellicle pasted mask is stored as an inspection failure pellicle pasted mask in the inspection failure pellicle pasted mask discharge unit 29B. The inspection interruption pellicle pasted mask which is inspected at the first pellicle pasted mask inspection apparatus 28 or the second pellicle pasted mask inspection apparatus 29 is stored in the inspection interruption pellicle pasted mask discharge unit 29D.

The operation of the pellicle pasting system 20 according to the present invention will now be described.

In the pellicle pasting system 20 described above, the mask stored in the mask storage unit 22A of the mask washing apparatus 22 is transported to the mask washing unit 22B using the mask transport apparatus 22F, and is stored in the washed mask discharge unit 22C after being washed according to conditions designated by the operator.

The washed mask which is stored in the washed mask discharge unit 22C is stored in the mask storage unit 23A of the first mask inspection apparatus 23 by the mask transport apparatus 30A through the transport path 30.

In the pellicle pasting system 20, each unit of the mask washing apparatus 22 and the first mask inspection apparatus 23 is provided as a clean room environment. Moreover, the washed mask is transported from the mask washing apparatus 22 to the first mask inspection apparatus 23 using the mask transport apparatus 30A rather than manually. Consequently, the attachment of foreign objects to the washed mask is prevented during the transport of the washed mask from the mask washing apparatus 22 to the first mask inspection apparatus 23.

The washed mask which is stored in the mask storage unit 23A of the first mask inspection apparatus 23 is transported to the mask inspection unit 23B using the mask transport apparatus 32 and is inspected as to whether any first foreign objects are attached. If the washed mask is an inspection passing mask by the mask inspection unit 32B, the inspection passing mask is transported to the mask inspection unit 24A of the second mask inspection apparatus 24 using the mask transport apparatus 32. Moreover, if the washed mask is an inspection failure mask by the mask inspection unit 23, the inspection failure mask is stored in the inspection failure mask discharge unit 23C using mask transport apparatus 32.

Hence, in the pellicle pasting system 20, the inspection failure mask which fails the inspection at the first mask inspection apparatus 23 may be stored separately from the inspection passing mask in the inspection failure mask discharge unit 23C. Accordingly, the inspection failure mask is no longer needed to be transported to the second mask inspection apparatus 24 and to the steps beyond, thereby eliminating the trouble to differentiate between an inspection passing mask and an inspection failure mask. As a result, the processing time of the pellicle pasting system 20 is significantly reduced, and the inspection failure mask is easily managed.

Moreover, each of the first mask inspection apparatus 23 and the second mask inspection apparatus 24 is structured as one clean room, and the inspection passing mask is transported to the second mask inspection apparatus 24 by the mask transport apparatus 32 rather than manually. Hence, the attachment of foreign objects to the inspection passing mask is prevented during the transportation of the inspection passing mask to the second mask inspection apparatus 24.

The inspection passing mask from the first mask inspection apparatus 23 is transported to the second mask inspection apparatus 24 so that the mask inspection unit 24A determines whether any second foreign objects are present. The inspection passing mask from the mask inspection unit 24A is transported to the pellicle pasting unit 25A of the pellicle pasting apparatus 25 using the mask transport apparatus 32. Moreover, the inspection failure mask from the mask inspection unit 24A is stored in the inspection failure mask discharge unit 24B.

Hence, in the pellicle pasting system 20 of the present invention, the inspection failure mask from the second mask inspection apparatus 24 may be stored separately from the inspection passing mask stored in the inspection failure mask discharge unit 24B. Thus, the inspection failure mask is no longer needed to be transported to the pasting apparatus 25 and to the steps beyond, thereby eliminating the trouble of differentiating between the inspection passing mask and the inspection failure mask. As a result, the processing time of the pellicle pasting system 20 is significantly reduced, and the inspection failure mask is easily managed.

Moreover, each of the second mask inspection apparatus 24 and the pasting apparatus 25 is structured as one clean room, and the inspection passing mask is transported to the pasting apparatus 32 using the mask transport apparatus 32 rather than manually. Thus, the attachment of any foreign objects to the inspection passing mask is prevented during the transportation of the inspection passing mask to the pasting apparatus 25.

The inspection passing mask from the second mask inspection apparatus 24 is transported to the pellicle pasting unit 25A and stored in the pellicle pasted mask discharge unit 25B after the pellicle transported from the pellicle storage apparatus 26 and is pasted on the mask. Here, when the inspection passing mask is transported from the mask inspection apparatus 24 to the pellicle pasting unit 25A, the pellicle corresponding to the inspection passing mask is transported from the pellicle storage apparatus 26 using the pellicle transport apparatus 33. Thus, the operation of pasting pellicle on the mask is executed without stopping each at processing step of the pellicle pasting system 20. Hence, the processing time of pellicle pasting system 20 is substantially reduced.

Moreover, the pellicle stored in the pellicle storage unit 27B is automatically inspected at the pellicle inspection unit 27A. Hence, the inspection time of the pellicle is significantly reduced and the inspection accuracy is substantially improved as compared to the conventional method using visual observation.

Moreover, each of the pellicle inspection apparatus 27 and the pellicle storage apparatus 26 is structured as one clean room. In addition, the inspection passing pellicle is transported to the pellicle storage apparatus 26 using the pellicle transport apparatus 33 rather than manually. Hence, the attachment of foreign objects to the pellicle is prevented during transport of the inspection passing pellicle to the pellicle transport apparatus 26.

Furthermore, each of the pasting apparatus 25 and the pellicle storage apparatus 26 is provided as one clean room and the inspection passing pellicle from the pellicle storage unit 26A is transported using the pellicle transport apparatus 33. Hence, the attachment of foreign objects to the pellicle is prevented during transport of the inspection passing pellicle to the pellicle pasting unit 25.

The pellicle pasted mask from the pellicle pasted mask discharge unit 25B is stored in the pellicle pasted mask storage unit 28A of the first pellicle pasted mask inspection apparatus 28 using the pellicle pasted mask transport apparatus 34A through the transport path 34. Here, each of the pasting apparatus 25 and the first pellicle pasted mask inspection apparatus 28 is provided as one clean room, and the pellicle pasted mask is transported to the first pellicle pasted mask inspection apparatus 28 without manual manipulation. Hence, a danger of foreign objects attaching to the pellicle pasted mask is reduced when the pellicle pasted mask is transported from the pasting apparatus 25 to the first pellicle pasted mask inspection apparatus 28.

Moreover, the pellicle pasted mask from the pellicle pasted mask discharge unit 25B is stored in the pellicle pasted mask storage unit 28A of the first pellicle pasted mask inspection apparatus 28 using the pellicle pasted mask transport apparatus 34A. Hence, attachment of foreign objects to the pellicle pasted mask is prevented during transport of the pellicle pasted mask from the pellicle pasted mask discharge unit 25B to the pellicle pasted mask storage unit 28A of the first pellicle pasted mask inspection apparatus 28. Here, even if the pellicle is pasted on the mask, foreign objects may attach to the pellicle itself if the pellicle pasted mask is transported to the first pellicle pasted mask inspection apparatus 28 using human hands. Hence, it is important to remove any danger of such foreign objects attaching to the pellicle pasted mask.

The pellicle pasted mask from the pellicle pasted mask storage unit 28A of the first pellicle pasted inspection apparatus 28 is transported to the pellicle pasted mask inspection unit 28B using the pellicle pasted mask transport unit 35. The pellicle pasted mask inspected unit 28B then determines whether any first foreign object are attached.

An inspection passing pellicle pasted mask from the mask inspection unit 28B is transported to the pellicle pasted mask inspection unit 29A of the fourth inspection apparatus using the pellicle pasted mask transport apparatus 35. Moreover, an inspection failure pellicle pasted mask from the mask inspection unit 28B is stored in the pellicle inspection failure pellicle pasted mask discharge unit 29B using the pellicle pasted mask transport apparatus 35.

Moreover, each of the first pellicle pasted mask inspection apparatus 28 and the second pellicle pasted mask inspection apparatus 29 is provided as one clean room, and the inspection passing pellicle pasted mask is transported to the fourth inspection apparatus 28 using the pellicle pasted mask transport apparatus 34 without manual manipulation. Hence, attachment of foreign objects to the inspection passing pellicle pasted mask is prevented during the transportation of the inspection passing pellicle pasted mask from the first pellicle pasted mask inspection apparatus 28 to the second pellicle pasted mask inspection apparatus 29.

The inspection passing pellicle pasted mask which is transported from the first pellicle pasted mask inspection apparatus 28 to the second pellicle pasted mask inspection apparatus 29 is inspected as to whether any second foreign objects are attached to the second pellicle pasted mask inspection apparatus 29. The inspection passing pellicle pasted mask is stored in the inspected pellicle pasted mask discharge unit 29C using the pellicle pasted mask transport apparatus 35. Moreover, the inspection failure pellicle pasted mask is stored in the inspection failure pellicle pasted mask discharge unit 29B by the pellicle pasted mask transport apparatus 35.

Hence, the inspection failure pellicle pasted mask from the first pellicle pasted mask inspection apparatus 28 or the second pellicle pasted mask inspection apparatus 29 may be stored separately from the inspection passing mask in the inspection failure pellicle pasted mask discharge unit 29B, thereby eliminating troubles of differentiating between the inspection passing pellicle pasted mask and the inspection failure pellicle pasted mask. As a result, the processing time of the pellicle pasting apparatus is significantly reduced, and the inspection failure pellicle pasted mask is easily managed.

Moreover, inspection of whether any first and the second foreign objects are attached in the pellicle pasted mask is executed by the first pellicle pasted mask inspection apparatus 28 and the second pellicle pasted mask inspection apparatus 29 even for the pellicle pasted mask, thereby improving the pellicle pasting yields.

On the other hand, the masks from each of the inspection failure mask discharge unit 23C of the first mask inspection apparatus 23 and the inspection failure mask discharge unit 24B of the second mask inspection apparatus 24 are stored in the interruption mask storage unit 22D of the mask washing apparatus 22 using the mask transport apparatus 31A. Here, in order to process the inspection failure masks stored in the interruption mask storage unit 22D, the operator designates the process order for each of the inspection failure masks. By doing such, the mask which is stored in the interruption mask storage unit 22D is transported to the mask washing unit 22B to be washed by the mask transport apparatus 22F. After being washed, the mask is stored in the washed mask discharge unit 22C and the steps described above will be executed.

Hence, the inspection failure mask may be transported to the interruption mask storage unit 22D of the mask washing apparatus 22 automatically to be immediately reprocessed. As a result, the processing time for a single lot is substantially reduced.

Moreover, the masks stored in each of the inspection failure mask discharge unit 23C and 24B are stored in the interruption mask storage unit 22D of the mask washing apparatus 22 using the mask transport apparatus 31A without manual manipulation. Hence, attachment of foreign objects which are difficult to be washed off is prevented during the transport of the inspection failure mask to the interruption mask storage unit 22D. Even though the masks pass inspection if the washing process is executed, manual transport of the inspection failure masks to the interruption storage unit 22D may cause attachment of foreign objects which are difficult to be washed off. Hence, it is important to eliminate the danger of foreign objects attaching to the mask by transporting the inspection failure mask using the mask transport apparatus 31A.

Here, if the washing interruption mask is stored in the interruption mask storage unit 22D, the washing interruption mask is transported to the mask washing unit 22B using the mask transport apparatus 31A according to a process order designated by the operator. After being washed, the mask is stored in the washed mask interruption discharge unit 22B.

Thus, only the washing process may be executed for the mask by storing the washing interruption mask in the interruption mask storage unit 22D and designating the process order for the washing interruption mask.

Moreover, if the inspection interruption mask is stored in the inspection interruption mask storage unit 23D, the inspection interruption mask is transported to the mask inspection unit 23B and/or the mask inspection unit 24A to be inspected by the mask transport apparatus 32 as a result of the operator designating the process order for the inspection interruption mask and the content of the inspection. That is, the inspection at the first mask inspection apparatus 23, the inspection at the second mask inspection apparatus 24, or the inspection at the first and the second inspection apparatus 23 and 24.

In this case, if the operator designates only the inspection at the first mask inspection apparatus 23 as the content of the inspection for the inspection interruption mask, the inspection interruption mask is stored in the inspected interruption mask discharge unit 24C of the second mask inspection apparatus 24 using the mask transport apparatus 32, after inspecting the inspection interruption mask at the mask inspection unit 23B. Moreover, if the operator designates only the inspection at the second mask inspection apparatus 24 as the inspection for the inspection interruption mask, the inspection interruption mask is stored in the inspected interruption mask discharge unit 24C after the inspection interruption mask is transported to and inspected at the mask inspection unit 24A of the second mask inspection apparatus 24 by the mask transport apparatus 32. Moreover, if the operator designates both inspections at the first and the second inspection apparatus 23 and 24 as the inspection for the inspection interruption mask, the inspection interruption mask is transported to and inspected at the mask inspection unit 23B using the mask transport apparatus 32, then is transported to and inspected at the mask inspection unit 24A of the second mask inspection apparatus 24 using the mask transport apparatus 32. Then, the inspection interruption mask is stored in the inspection interruption mask discharge unit 24C using the mask transport apparatus 32. Here, the result of the inspection of the interruption mask is sent to the host computer 21 from the first mask inspection apparatus 23 and/or the second mask inspection apparatus 24 in the form of signals corresponding to the inspection result.

Hence, the inspection for the inspection interruption mask may be executed by storing the inspection interruption mask in the inspection interruption mask storage unit 23D and by designating the process order and the content of the inspection for the inspection interruption mask.

Moreover, if the pellicle pasting interruption mask is stored in the pellicle pasting interruption mask storage unit 25C, the pellicle pasting interruption mask is transported to the pellicle pasting unit 25A using the mask transport apparatus 32 where the pellicle corresponding to the pellicle pasting interruption mask is pasted on the pellicle pasting interruption mask by the designation of the operator of the process order for the pellicle pasting interruption mask, after which the pellicle pasting interruption mask is stored in the pellicle pasted interruption mask discharge unit 25D. Here, if the pellicle corresponding to the pellicle pasting interruption mask which is stored in the pellicle pasting interruption mask storage unit 25C is not in the pellicle storage 26A of the pellicle storage apparatus 26, the type of pellicle corresponding to the pellicle pasting interruption mask is stored in the pellicle interruption storage unit 26B of the pellicle storage apparatus 26. By doing this, the pellicle pasting process for the pellicle pasting interruption mask may be executed without stopping the process at each apparatus in the pellicle pasting apparatus 20. Hence, the pellicle pasting process may be executed by storing the pellicle pasting interruption mask in the pellicle pasting interruption mask storage unit 25C and by designating the process order for the pellicle pasting interruption mask.

Moreover, if the inspection interruption pellicle pasted mask is stored in the pellicle pasted mask storage unit 23C, the inspection interruption pellicle pasted mask is transported to the pellicle pasted mask inspection unit 28B and/or the pellicle pasted mask inspection unit 29A to be inspected by the mask transport apparatus 32 in accordance with the operator designated the process order. That is, the inspection at the first pellicle pasted mask inspection apparatus 28, the inspection at the second mask inspection apparatus 29, or the inspection at both apparatus 28 and 29. In this case, if the operator designates only the inspection at the first pellicle pasted mask inspection apparatus 28 for the inspection interruption pellicle pasted mask, the inspection interruption pellicle pasted mask is stored in the inspected interruption pellicle pasted mask discharge unit 29D of the second pellicle pasted mask inspection apparatus 29 using the pellicle pasted mask transport apparatus 35, after the inspection interruption pellicle pasted mask is inspected at the pellicle pasted mask inspection unit 28B. Also, if the operator designates only the inspection at the second pellicle pasted mask inspection apparatus 29 for the inspection interruption pellicle pasted mask, the inspection interruption pellicle pasted mask is stored in the inspected interruption pellicle pasted mask discharge unit 29D, after the inspection interruption pellicle pasted mask is transported to and inspected at the pellicle pasted mask inspection unit 29A of the second pellicle pasted mask inspection apparatus 29 using the pellicle pasted mask transport apparatus 35. If the operator designates both inspections at inspection apparatus 28 and 29 for the inspection interruption pellicle pasted mask, the inspection interruption pellicle pasted mask is transported to and inspected by the pellicle pasted mask inspection unit 28B using the pellicle pasted mask transport apparatus 35. Then, it is transported to and inspected by the pellicle pasted mask inspection unit 29A of the second pellicle pasted mask inspection apparatus 29 using the pellicle pasted mask transport apparatus 35. Next, the inspection interruption pellicle pasted mask is stored in the inspection interruption pellicle pasted mask discharge unit 29D using the pellicle pasted mask transport apparatus 35. Here, the result of the inspection of the inspection interruption pellicle pasted mask is sent to the host computer 21 from the first pellicle pasted mask inspection apparatus 28 and/or the second pellicle pasted mask inspection apparatus 29 as signals corresponding to the inspection result.

Hence, the inspection for the inspection interruption pellicle pasted mask is executed by storing the inspection interruption pellicle pasted mask in the inspection interruption pellicle pasted mask storage unit 28C and designating the process order and the content of the inspection for the inspection interruption pellicle pasted mask.

Figure 5A:
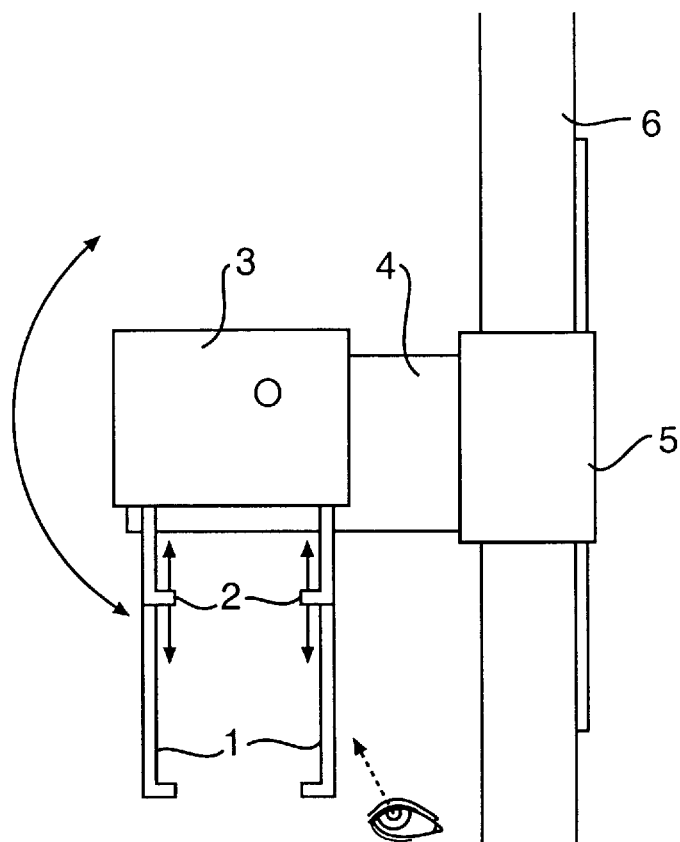
FIGS. 5A and B are diagrams of a transport apparatus in accordance with the present invention.
Figure 5B:
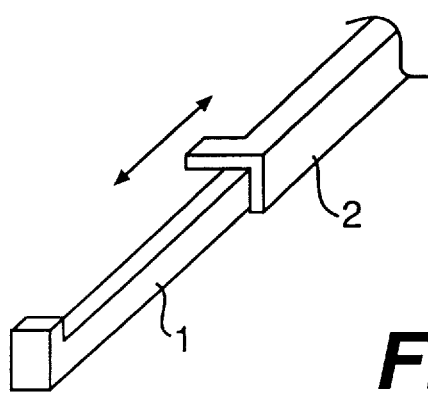
Figure 8:
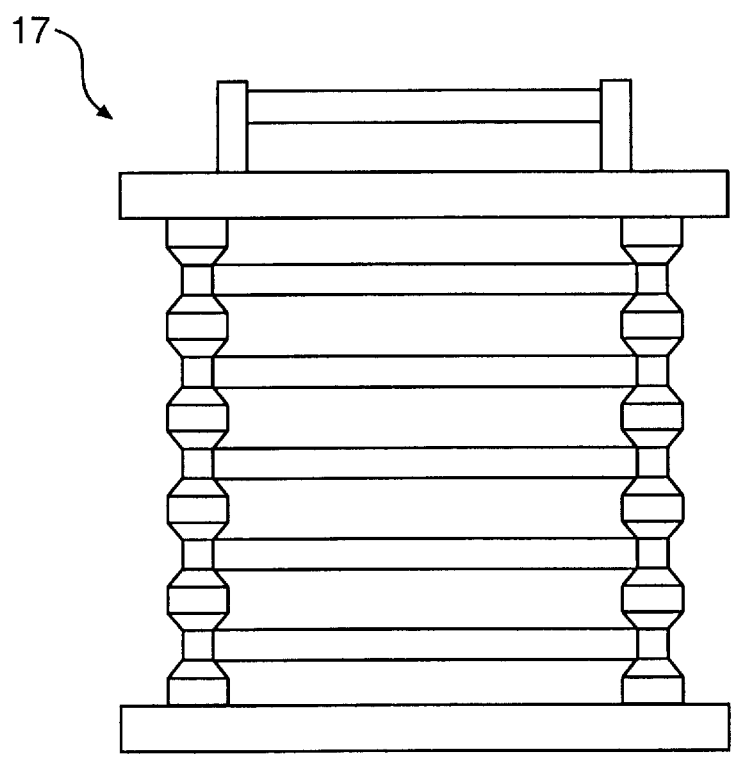
FIG. 8 is a schematic line drawing of the structure of a mask storage case.

The structure of the transport apparatus 30A, 31A, 32, 34A, and 35 will now be described. FIG. 5A shows a diagram of the transport apparatus in accordance with the present invention, and FIG. 5B shows a perspective detailed view of a portion of the transport apparatus.

The transport apparatus, as shown, has arm fingers 1 and 2, an arm finger drive unit 3 attached within the drive motor for driving the arm finger in the direction of the arrow, a drive unit 5 within which is attached a drive motor for moving the transport device along a rail 6, and an arm 4 which is fixed to the drive unit 5 to support the rotating drive 3.

The transport device is capable of moving along the rail 6 by means of the drive unit 5. Also, with the transport device, the arm fingers are inserted into the bottom side of an extended mask. Once the arm fingers are inserted into the bottom side of the mask, the arm finger drive unit 3 pulls the arm fingers 1 and 2 upwardly, thereby raising the mask.

Therefore, the arm finger 2 moves in the direction of the arrow by means of an arm finger drive cylinder, not shown, the raised mask is interposed between the fingers 1 and 2, thereby securing the mask. Thus, with the mask in the secured state, the drive motor within the drive unit 5 is driven, and transported to the device which accomplishes the next process.

At the time of transporting to the device which accomplishes the next process, the arm fingers 1 and 2 are inserted into the device which precedes the arm finger drive unit 3. At this time, the rotating motor attached within the arm finger drive unit 3 is driven, and the direction in which the arms fingers protrude is rotated 180 degrees.

The construction of the arm finger 1 and the arm finger 2 has been drawn on the bottom side of the appended FIG. 5. The mask and reticle become interposed in the arm finger protrusions.

Some of the advantages of the pellicle pasting system in accordance with the present invention will now be discussed.

In the structure described above, movement of the mask between the mask washing apparatus 22 and the first mask inspection apparatus 23 is executed by the mask transport apparatus 30. Movement of the mask between the first mask inspection apparatus 23 and the second mask inspection apparatus 24 and movement of the mask between the second mask inspection apparatus 24 and the pasting apparatus 25 are executed by the mask transport apparatus 32. Movement of the pellicle between the pellicle inspection apparatus 27 and the pellicle storage apparatus 26 and movement of the pellicle between the pellicle storage apparatus 26 and the pasting apparatus 25 are executed by the pellicle transport apparatus 33. Movement of the pellicle pasted mask between the pasting apparatus 25 and the first pellicle pasted mask inspection apparatus 28 is executed by the pellicle pasted mask transport apparatus 34. Movement of the pellicle pasted mask between the first pellicle pasted mask inspection apparatus 28 and the second pellicle pasted mask inspection apparatus 29 is executed by the mask transport apparatus 35, hence each apparatus is connected by the transport apparatus. As a result, movement of the mask, the pellicle, and the pellicle pasted mask is executed without manual manipulation, thereby preventing attachment of foreign objects to the mask, pellicle, and the pellicle pasted mask during transport between steps. Thus, the pellicle pasting system 20 and the pellicle pasting method of the present invention obtains increased yields.

Moreover, in the structure described above, each of the mask washing apparatus 22, the first mask inspection apparatus 23, the second mask inspection apparatus 24, the pasting apparatus 25, the pellicle storage apparatus 26, the pellicle inspection apparatus 27, the first pellicle pasted mask inspection apparatus 28, and the second mask inspection apparatus 29 is disposed in a clean room with a predetermined purity level. The transport path 30 and 31 have sealed path to maintained a predetermined purity level. Because movement of the mask, pellicle, and the pellicle pasted mask is executed using the transport apparatus, further cleanliness is achieved in the pellicle pasting apparatus 20 of the present invention, thereby enabling further improvement of yields.

Furthermore, in the structure described above, each of the first and the second mask inspection apparatus 22 and 23 is equipped with the inspection failure mask discharge unit 23C and 24B, and the interruption mask storage unit 22D is provided for the mask washing apparatus 22 to transport the inspection failure mask from the inspection failure mask discharge unit 23C or 24B to the interruption mask storage unit 22D using the mask transport apparatus 31A. Hence, steps in transporting the inspection failure mask to the second mask inspection apparatus and beyond are eliminated, and the trouble of differentiating the inspection passing mask and the inspection failure mask is omitted. This enables immediate re-processing of the inspection failure mask and simplifies management of the inspection failure mask.

Moreover, in the present invention, the pellicle storage apparatus 26 is provided for the inspection passing pellicle during the inspection of the pellicle inspection apparatus 27, and when the inspection passing mask is transported from the second mask inspection apparatus 24 to the pellicle pasting unit 25A, the pellicle corresponding to the inspection passing mask is transported from the pellicle storage apparatus 26 to the pellicle pasting unit 25A. Hence, operation of pasting pellicle on the mask is executed without stopping each process step of the pellicle pasting system 20, thereby enabling substantial reduction in processing time.

Furthermore, in the structure described above, the mask storage unit 22C and the washed interruption mask discharge unit 22E are provided in the mask washing apparatus 22 and the operator designates the process order for the washing interruption mask. Hence, the only washing process is executed for the mask, thereby enabling further improvement in effectiveness of the pasting system 20.

Moreover, the inspection interruption mask storage unit 23D is provided in the first mask inspection apparatus 23 and the inspection interruption mask discharge unit 24C is provided in the second mask inspection apparatus 24. Hence, the content of the inspection for the inspection interruption mask is designated by the operator, thereby enabling further improvement in effectiveness of the pellicle pasting system 20.

Furthermore, in the structure described above, the pellicle pasting interruption mask storage 25C and the pellicle pasted interruption mask discharge unit 25D are provided in the pasting apparatus 25 and the operator designates the process order for the pellicle pasting interruption mask. Hence, only the pellicle pasting process is executed for the mask, thereby enabling further improvement in effectiveness of the apparatus as the pellicle pasting system 20.

Moreover, in the structure described above, the inspection interruption pellicle pasted mask storage unit 28C is provided in the first pellicle pasted mask inspection apparatus 28 and the inspection interruption pellicle pasted mask discharge unit 29D is provided in the second pellicle pasted mask inspection apparatus 29, and the operator designates the process order for the inspection interruption pellicle pasted mask and the content of the inspection. Hence, the inspection corresponding to the content of the inspection is executed for the inspection interruption pellicle pasted mask, thereby enabling further improving the effectiveness of the pellicle pasting system 20.

Figure 3:
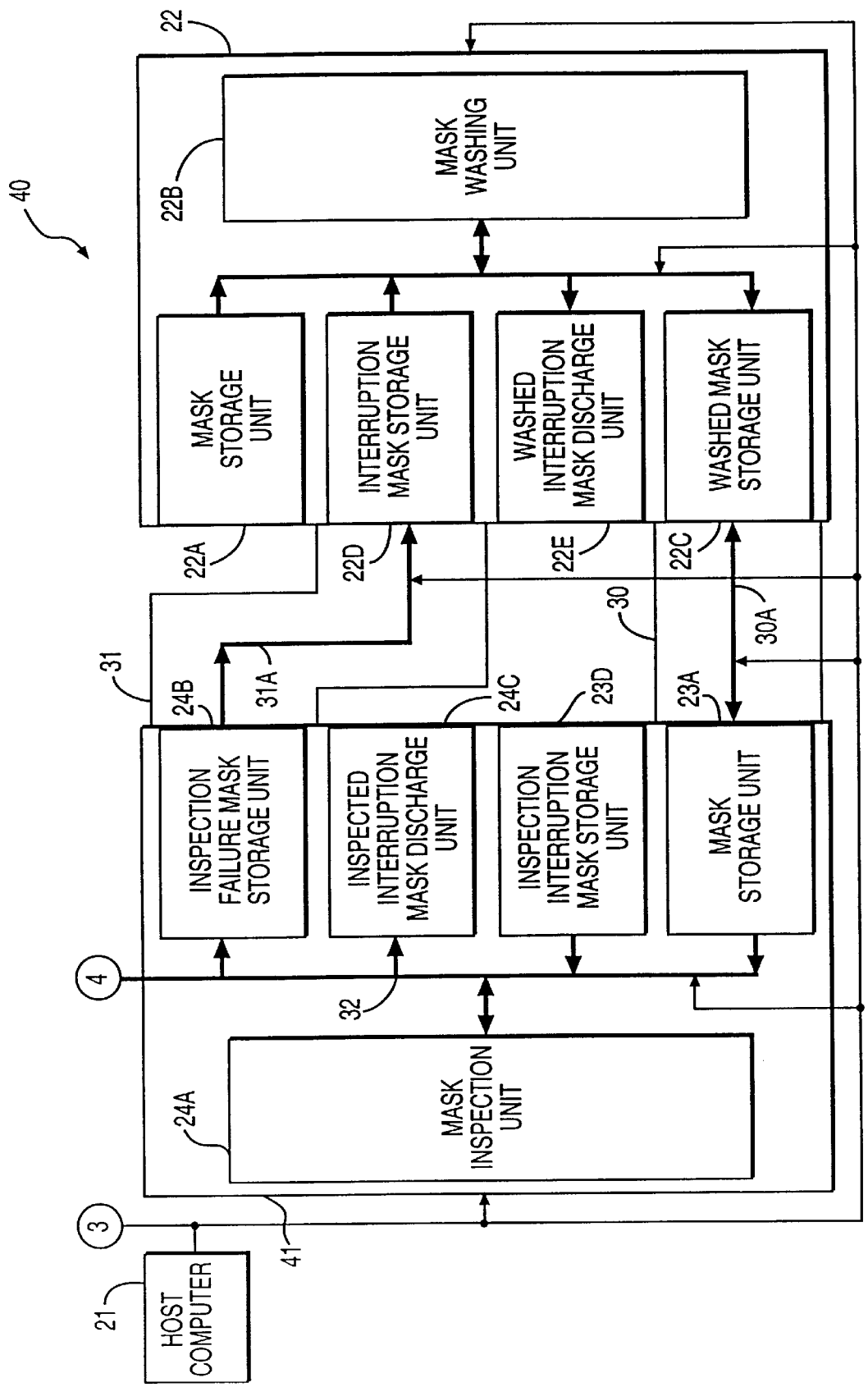
FIGS. 3 and 4 are block diagrams of the structure of the pellicle pasting system according to a second embodiment.
Figure 4:
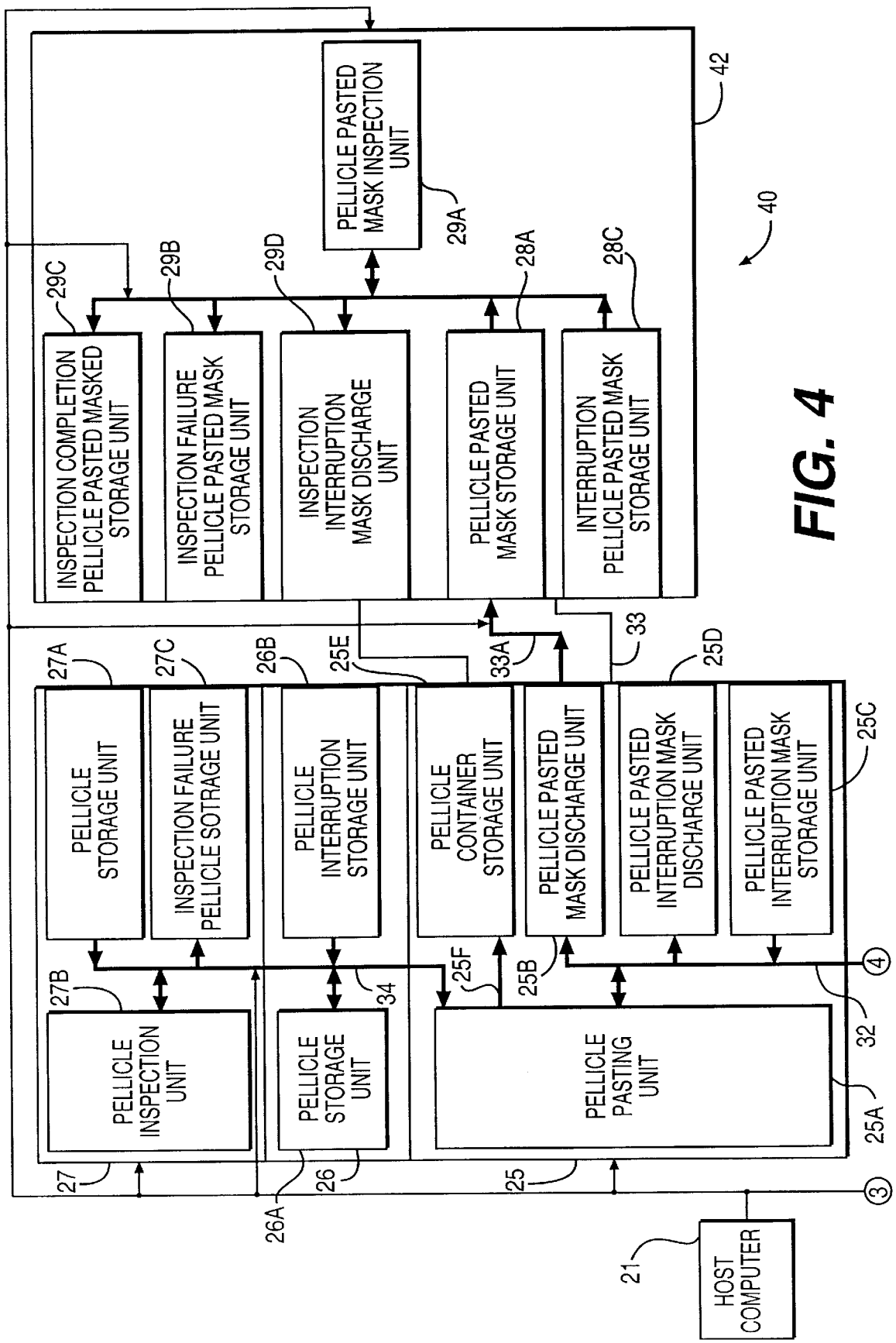

Moreover, in the embodiment described above, the pellicle pasting system 20 comprises the host computer 21, mask washing apparatus 22, the first mask inspection apparatus 23, the second mask inspection apparatus 24, the pasting apparatus 25, the pellicle storage apparatus 26, the pellicle inspection apparatus 27, the first pellicle pasted mask inspection apparatus 28 and the second pellicle pasted mask inspection apparatus 29, but the present invention is not limited to such structure. A similar effectiveness as the embodiment above may be obtained if the pellicle pasting system 40 comprises a host computer 21, a mask washing apparatus 22, a mask inspection apparatus 41, a pasting apparatus 25, a pellicle storage apparatus 26, a pellicle inspection apparatus 27, and a pellicle pasted mask inspection apparatus 42, as shown in FIGS. 3 and 4.

The mask storage unit 23A and the inspection interruption mask storage unit 23D are provided in the second mask inspection apparatus 24 of the pellicle pasting apparatus 40 are provided in the mask inspection apparatus 41 which determines whether any second foreign objects are attached to the mask. Moreover, the pellicle pasted mask storage unit 28C and the pellicle pasted mask storage unit 28A of the pellicle pasting system 40 are provided in the second pellicle pasted mask inspection apparatus 29 of the pellicle pasted mask inspection apparatus 42 which determines whether any second foreign objects are attached to the pellicle pasted mask.

Moreover, in the pellicle pasting system 40, the inspection failure mask discharge unit 24B of the mask inspection apparatus 41 and the interruption mask storage unit 22D of the mask washing apparatus 22 are connected through the transport path 31. Furthermore, the pellicle pasted mask discharge unit 25B of the pasting apparatus 25 and the pellicle pasted mask storage unit 28A of the pellicle pasted mask inspection apparatus 42 are connected through the transport path 33. Here, the pellicle pasting system 40 determines whether any first foreign objects are attached to the mask using the inspection at the mask inspection apparatus 41 and the pellicle pasted mask inspection apparatus 42.

Moreover, each of the first mask inspection apparatus 23, the second mask inspection apparatus 24, pasting apparatus 25, the pellicle storage apparatus 26 and the pellicle inspection apparatus 27 is provided in one clean room. However, the present invention is not limited to the embodiment. For example, all of the first mask inspection apparatus 23, the second mask inspection apparatus 24, pasting apparatus 25, the pellicle storage apparatus 26 and the pellicle inspection apparatus 27 may be provided in one clean room. Alternatively, the first mask inspection apparatus 23 and the second inspection apparatus may be combined in one clean room with the pellicle storage apparatus 26 and the pellicle inspection apparatus 27 combined in another clean room. Obviously, various other combinations may be provided in one clean room.

Furthermore, the pellicle pasting system 20 comprising the pellicle storage apparatus 26, the pellicle inspection apparatus 27, the first pellicle pasted mask inspection apparatus 28, and the second pellicle pasted inspection apparatus 29 is used as the pellicle pasting system, but the present invention is not limited to the above embodiment and various other pellicle pasting systems may be used as the pellicle pasting system.

In the present invention as described above, movement of the mask from the washing apparatus to the first inspection apparatus and the movement of the mask from the first inspection apparatus, the pellicle pasting apparatus may be executed without manual manipulation by having a washing apparatus to wash the mask, a first mask transport apparatus to transport the mask which is washed by the washing apparatus, a first mask inspection apparatus to determine whether foreign objects are attached to the mask from the first mask transport apparatus, a second mask transport apparatus to transport the mask when the first mask inspection apparatus determines that the foreign objects are not attached on the mask, and a pasting apparatus to paste the pellicle on the mask which is to be transported by the second mask transport apparatus. Hence, attachment of the foreign objects on the mask prevented during moving of the mask to the first mask inspection apparatus, and attachment of the foreign objects is prevented during the movement of the mask from the first mask inspection apparatus to the pasting apparatus. Thus, the pellicle pasting system and method achieves improved yields.

It will be apparent to those skilled in the art that various modifications and variations can be made in the pellicle pasting system and method of the present invention without departing from the spirit or scope of the invention. Thus, it is intended that the present invention cover the modifications and variations of this invention provided they come within the scope of the appended claims and their equivalents.

What is claimed is:

1. A pellicle pasting system for pasting a pellicle on a mask, the system comprising:
    a washing apparatus to wash the mask;
    a first mask transport apparatus to transport the mask washed by the washing apparatus;
    a first inspection apparatus to inspect whether foreign objects are attached to the mask received from the first mask transport apparatus;
    a second mask transport apparatus to transport the mask when the first inspection apparatus determines that the foreign objects are substantially absent from the mask; and
    a pellicle pasting apparatus to paste the pellicle on the mask received from the second mask transport apparatus.

2. The pellicle pasting system according to claim 1, wherein the first inspection apparatus includes an inspection failure mask storage unit to store the mask as an inspection failure mask if the foreign objects are attached.

3. The pellicle pasting system according to claim 2, wherein the washing apparatus includes a failure mask storage unit to store the failure mask received from the failure mask storage unit.

4. The pellicle pasting system according to claim 3, further comprising a third mask transport apparatus to transport the failure mask stored in the failure mask storage unit to the failure mask storage unit of the washing apparatus.

5. The pellicle pasting system according to claim 1, wherein the washing apparatus includes a first mask storage unit to store a mask as an interruption mask for which only a washing process has been performed by the washing apparatus, and a second mask storage unit to store the interruption mask which is washed by the washing apparatus.

6. The pellicle pasting system according to claim 1, wherein the first inspection apparatus includes a first mask storage unit to store a mask as an inspection interruption mask for which only an inspection has been performed by the first inspection apparatus, and a second mask storage unit to store the inspection interruption mask inspected by the first inspection apparatus.

7. The pellicle pasting system according to claim 1, wherein the first inspection apparatus includes a plurality of inspection units each corresponding to a foreign object type wherein the first inspection apparatus inspects whether the foreign objects are attached to the mask using the plurality of the inspection units.

8. The pellicle pasting system according to claim 1, wherein the pellicle pasting apparatus comprises a first mask storage unit to store a mask as a pellicle pasting interruption mask for which a pellicle pasting process is to be performed by the pellicle pasting apparatus, and a second mask storage unit to store the pellicle pasting interruption.

9. The pellicle pasting system according to claim 1, further comprising a second inspection apparatus to inspect whether the foreign objects are attached to a pellicle pasted mask received from the pellicle pasting apparatus.

10. The pellicle pasting system according to claim 9, further comprising a pellicle pasted mask transport apparatus to transport the pellicle pasted mask to the second inspection apparatus.

11. The pellicle pasting system according to claim 9, wherein the second inspection apparatus includes a first pellicle pasted mask storage unit to store the pellicle pasted mask for which only an inspection is to be performed by the second inspection apparatus and a second pellicle pasted mask storage unit to store the pellicle pasted mask for which the inspection is performed by the second inspection apparatus.

12. The pellicle pasting system according to claim 9, wherein the second inspection apparatus includes a plurality of inspection units each corresponding to foreign object types wherein the second inspection apparatus determines whether the foreign objects are attached to the pellicle pasted mask using the plurality of the inspection units.

13. The pellicle pasting system according to claim 1, further comprising a pellicle inspection apparatus to inspect whether foreign objects are attached to the pellicle and a pellicle transport apparatus to transport the pellicle from the pellicle inspection apparatus to the pellicle pasting apparatus if the pellicle inspection apparatus determines that the foreign objects are substantially absent from the pellicle.

14. The pellicle pasting system according to claim 13, further comprising a pellicle storage apparatus to store the pellicle that is determined to be substantially free of foreign objects by the pellicle inspection apparatus, wherein the pellicle transport apparatus transports the pellicle stored in the pellicle storage apparatus to the pellicle pasting apparatus according to a signal from the pellicle pasting apparatus.

15. The pellicle pasting system according to claim 14, wherein the pellicle pasting apparatus includes a first mask storage unit to store a mask as a pellicle pasting interruption mask for which only a pellicle pasting process is to be performed by the pellicle pasting apparatus, and a second mask storage unit to store the pellicle pasting interruption mask for which pellicle pasting process is performed by the pellicle pasting apparatus, wherein the pellicle storage apparatus includes an interruption pellicle storage unit to store a pellicle as an interruption pellicle corresponding to the pellicle pasting interruption mask stored in the first mask storage unit of the pellicle pasting apparatus, and wherein the pellicle transport apparatus transports the interruption pellicle corresponding to the pellicle pasting interruption mask from pellicle storage unit to the pellicle pasting apparatus when the pellicle pasting interruption mask is stored in the first pellicle storage unit of the pellicle pasting apparatus.

16. The pellicle pasting system according to claim 1, wherein each one of the washing apparatus, the first mask transport apparatus, the first inspection apparatus, the second mask transport apparatus, the second inspection apparatus, and the pellicle pasting apparatus is disposed as a clean room environment to maintain a predetermined purity level.

17. A pellicle pasting method for pasting a pellicle on a mask, the method comprising:
    a washing step to wash the mask using a washing apparatus;
    a first mask transport step using a first transport apparatus to transport the washed mask from the washing apparatus to a first inspection apparatus;

a first inspection step using a first inspection apparatus to inspect whether foreign objects are attached to the mask transported by the first mask transport apparatus;

a second mask transport step to transport the mask from the first inspection apparatus to the pellicle pasting apparatus using the second mask transport means; and a pellicle pasting step to paste the pellicle on the mask using a pellicle pasting apparatus.

18. The pellicle pasting method according to claim 17, wherein the first inspection step includes a failure mask storage step to store the mask for which the foreign objects are attached as a failure mask in a failure mask storage unit in the first inspection apparatus.

19. The pellicle pasting method according to claim 18, further comprising a third mask transport step to transport the failure mask stored in the failure storage unit to the first mask storage unit in the washing apparatus using a third mask transport apparatus, and wherein the washing step washes the failure mask stored in the first mask storage unit.

20. The pellicle pasting method according to claim 17, wherein the washing step includes a washing interruption mask storage step to store the washing interruption mask after the washing in the second mask storage unit of the washing apparatus when the mask, for which only washing process is performed by the washing apparatus, is stored in the first mask storage unit of the washing apparatus and after the washing interruption mask is washed by the washing apparatus.

21. The pellicle pasting method according to claim 17, wherein the first inspection step includes an inspection step of the inspection interruption mask to store the inspection interruption mask after the inspection in the second mask storage unit of the first inspection apparatus when the mask, for which only inspection is performed by the first inspection step, is stored in the first mask storage unit of the first inspection apparatus and after the inspection interruption mask is inspected by the first inspection apparatus.

22. The pellicle pasting method according to claim 17, wherein the first inspection step includes a plurality of inspections each corresponding to foreign objects types, wherein the first inspection step inspects whether the foreign objects are attached to the mask using the plurality of inspections.

23. The pellicle pasting method according to claim 17, wherein the pellicle pasting step includes, a pellicle pasting step of the pellicle pasting interruption mask which stores the pellicle pasting interruption mask after pasting of the pellicle in the second mask storage unit of the pellicle pasting apparatus when the mask for which only pellicle pasting process is to be performed by the pellicle pasting process is stored in the first mask storage unit of the pellicle pasting apparatus as a pellicle pasting interruption mask and after the pellicle is pasted to the pellicle pasting interruption unit by the pellicle pasting apparatus.

24. The pellicle pasting method according to claim 17, further comprising a second inspection step to inspect whether the foreign objects are attached on a pellicle pasted mask for which the pellicle is pasted by the pellicle pasting step.

25. The pellicle pasting method according to claim 24, further comprising a pellicle pasted mask transport step to transport the pellicle pasted mask to the second inspection apparatus.

26. The pellicle pasting method according to claim 24, wherein the second inspection step includes an inspection step of the inspection interruption mask which stores the pellicle pasted inspection interruption mask after the inspection in the second pellicle pasted mask storage unit of the second inspection apparatus when the pellicle pasted mask for which only inspection is to be performed by the second inspection step is stored in the first pellicle pasted mask storage unit of the second inspection apparatus as a pellicle pasted mask, and after the inspection is made to determine whether the foreign objects are attached on the pellicle pasted inspection interruption mask.

27. The pellicle pasting method according to claim 24, wherein the second inspection step includes a plurality of inspections each corresponding to foreign object types wherein the second inspection step inspects whether the foreign objects are attached to the pellicle pasted mask by the plurality of inspections.

28. The pellicle pasting method according to claim 17, comprising a pellicle inspection step to inspect whether foreign objects are attached to the pellicle by a pellicle inspection unit, and a pellicle transport step to transport the pellicle which is determined not to have the foreign objects attached by the pellicle inspection unit to the pellicle pasting apparatus.

29. The pellicle pasting method according to claim 18, wherein the pellicle inspection step includes a pellicle storage step to store the pellicle which is determined not to have the foreign objects attached by the pellicle inspection apparatus in the first pellicle storage unit, and wherein the pellicle transport step transports the pellicle from the first pellicle storage unit to the pellicle pasting apparatus according to a request from the pellicle pasting apparatus.

30. The pellicle pasting method according to claim 28, wherein the pellicle transport step includes the pellicle transport step to transport the pellicle from the second pellicle storage unit which stores the pellicle corresponding to the pellicle pasting interruption mask to the pellicle pasting apparatus, when the pellicle pasting interruption mask for which only pellicle pasting process is to be performed by the pellicle pasting step is stored in the first mask storage unit of the pellicle pasting apparatus.

* * * * *